United States Patent [19]

Schneider et al.

[11] Patent Number: 5,051,813
[45] Date of Patent: Sep. 24, 1991

[54] PLASTIC-PACKAGED SEMICONDUCTOR DEVICE HAVING LEAD SUPPORT AND ALIGNMENT STRUCTURE

[75] Inventors: Mark R. Schneider; Michael J. Steidl, both of San Jose, Calif.

[73] Assignee: LSI Logic Corporation, Milpitas, Calif.

[21] Appl. No.: 619,108

[22] Filed: Nov. 27, 1990

Related U.S. Application Data

[63] Continuation-in-part of Ser. No. 454,752, Dec. 19, 1989.

[51] Int. Cl.[5] .................. H01L 23/48; H01L 23/28; H01L 23/02; H01L 39/02
[52] U.S. Cl. .................................. 357/72; 357/74; 357/70; 357/80
[58] Field of Search .................. 357/70, 72, 80, 74

[56] References Cited

U.S. PATENT DOCUMENTS 3,716,764 11/1973 Birchler et al. ............... 317/234
4,043,027 4/1977 Birchler et al. ............... 29/588
4,794,446 12/1988 Hamano ......................... 357/72
4,870,476 7/1989 Solstad .......................... 357/80

OTHER PUBLICATIONS

Microelectronics Packaging Handbook, Tummala and Rymaszewki, Van Nostrand Reinhold, 1988, pp. 578–591.

Primary Examiner—Jerome Jackson, Jr.
Assistant Examiner—Carl Whitehead, Jr.
Attorney, Agent, or Firm—Michael D. Rostoker; Gerald E. Linden

[57] ABSTRACT

A plastic-packaged semiconductor device, method of making same, and mounting same to a printed circuit board is disclosed. The device has a body, and a plurality of leads extending from the body. Plastic webs are formed between adjacent leads for supporting the leads. Plastic bumps are formed at the ends of the webs, and align with recesses between conductors of wiring patterns on printed circuit boards, aiding in alignment of the device with the board.

4 Claims, 4 Drawing Sheets 5,051,813

PLASTIC-PACKAGED SEMICONDUCTOR DEVICE HAVING LEAD SUPPORT AND ALIGNMENT STRUCTURE

CROSS-REFERENCE TO RELATED APPLICATIONS

This is a continuation-in-part of commonly-owned, copending U.S. patent application Ser. No. 454,752, entitled HEAT SINK FOR SEMICONDUCTOR DEVICE ASSEMBLY, filed on Dec. 19, 1989 by Jon Long, Mark Schneider, and Sandanand Patil.

FIELD OF THE INVENTION

The invention relates to the packaging of semiconductor devices, and more particularly to the following types of plastic-packaged semiconductor devices: DIP (dual in-line package), PQFP (plastic quad flat pack) and PLCC (plastic leaded chip carrier, and the like.

BACKGROUND OF THE INVENTION

Present plastic packaging techniques involve molding a plastic "body" around a semiconductor die. Prior to molding, the die is attached to a lead frame having a plurality of leads ultimately exiting the package for connecting the semiconductor device to external circuits, such as via conductors on a printed circuit board. Various forms of plastic packs are known, including DIP (Dual In-line Package), PQFP (Plastic Quad Flat Pack) and PLCC (plastic leaded chip carrier.

FIGS. 1A and 1B show a typical plastic-packaged semiconductor device 100 of the prior art. A semiconductor die 102 is connected, such as by a number of bond wires 104, to inner ends of a corresponding number of leads 106. Other techniques for connecting the die to the inner ends of the leads are known. A plastic body 108 is formed about the die 102 and the inner ends of the leads, by any of a number of known molding processes. The exposed outer portions of the leads 106, exterior the body 108, are bent downwardly (indicated by the dashed line "C") and outwardly (indicated by the dashed line "D") to form what is commonly termed a "gull wing" configuration. Each lead 106 has a width (w) on the order of six thousandths of an inch (0.2 mm), and the spacing (s) between adjacent leads 106 is typically on the order of ten thousandths of an inch (0.25 mm).

The present invention becomes important when lead "pitch", i.e. the center-to-center dimension between adjacent leads, is 0.5 mm or less, in which case the lead spacing "s" is on the order of 0.25 mm or less.

FIG. 1B shows a lead form (or frame) 120 having a plurality of leads 106. The lead frame is formed from a conductive foil having a thickness (t) on the order of a few thousandths of an inch (e.g. 0.004–0.006 inch). The material for the leads 106 is typically copper, or "Alloy 42". As shown, the leads 106 terminate in an outer square ring portion 122 of the lead frame 120, from which the completed (packaged) device is ultimately excised, as indicated by the dashed line "A". Of particular note in FIG. 1B are "dambars" 124 bridging adjacent leads 106 at a position indicated by the dashed line "B" (closely adjacent or immediately exterior to the body 108. The dambars 124 are formed from the conductive material forming the leads 106, and hence are of the same thickness as the leads 106. These dambars 124 aid in maintaining alignment between the inner ends of the leads, although a die attach pad (not shown) formed from the foil is typically employed and will serve the same purpose. More importantly, however, the dambars 124 are critical in the molding process.

In the molding process, the lead frame 120 (with die 102 attached) is pressed between the two "clamshell" halves of a mold (not shown). The die 102 and inner ends of the leads are contained within (the void of) the mold, which is filled with plastic. Since the leads create a gap between the clamshell halves of the mold, the dambars 124 prevent plastic from "flashing" between the leads 106 exterior the body 108. After the die is packaged in the plastic body, the dambars 124 are excised, and any residual plastic flash between the outer portions of leads 106 is cleaned out in a "dejunking" step.

As the lead count (number of leads) of semiconductor devices increases, the leads tend to become both thinner and narrower. (The spacing between leads is limited by practical minimums.) Hence, there arises difficulties during any handling of the devices in maintaining alignment between the leads, notably coplanarity and parallelness (and lack of skew) of the leads. Further, as the leads become more fragile, it becomes increasingly difficult to maintain alignment of the leads with the conductors of wiring patterns on printed circuit boards to which the semiconductor devices are mounted.

DISCLOSURE OF THE INVENTION

It is therefore an object of the present invention to provide a plastic-packaged semiconductor device having stiffer, stronger leads.

It is another object of the present invention to provide a technique for forming a plastic-packaged semiconductor device having stiffer, stronger leads.

It is a further object of the invention to provide a plastic-packaged semiconductor device having leads that are easier to maintain in alignment with wiring patterns on printed circuit boards.

It is a further object of the invention to provide a technique for forming a plastic-packaged semiconductor device having leads that are easier to maintain in alignment with wiring patterns on printed circuit boards.

It is another object of the present invention to provide an arrangement of a plastic-packaged semiconductor device and printed circuit board wherein it is easier to maintain the leads of the plastic-packaged semiconductor device in alignment with the conductors of wiring patterns on the printed circuit board.

According to the invention, a plastic-packaged semiconductor device has a molded plastic body and a plurality of leads exiting therefrom. In the molding process, plastic is allowed to flash between adjacent leads, forming webs therebetween. These webs may be excised in areas where the leads are to be bent, leaving only "tie bars" between the ends of the leads. Additionally, raised locating features, such as bumps, are formed on the webs (or tie bars) near the ends of the leads to aid in aligning the device with a printed circuit board having corresponding bump-receiving recesses formed therein.

It should be understood that the plastic-packaged semiconductor device of the present invention can be mounted to media other than printed circuit boards, but all such media will have connectivity locations such as the wiring patterns of the printed circuit boards.

Other objects, features and advantages of the invention will become apparent in light of the following description thereof.

DETAILED DESCRIPTION OF THE INVENTION

Figure 1A:
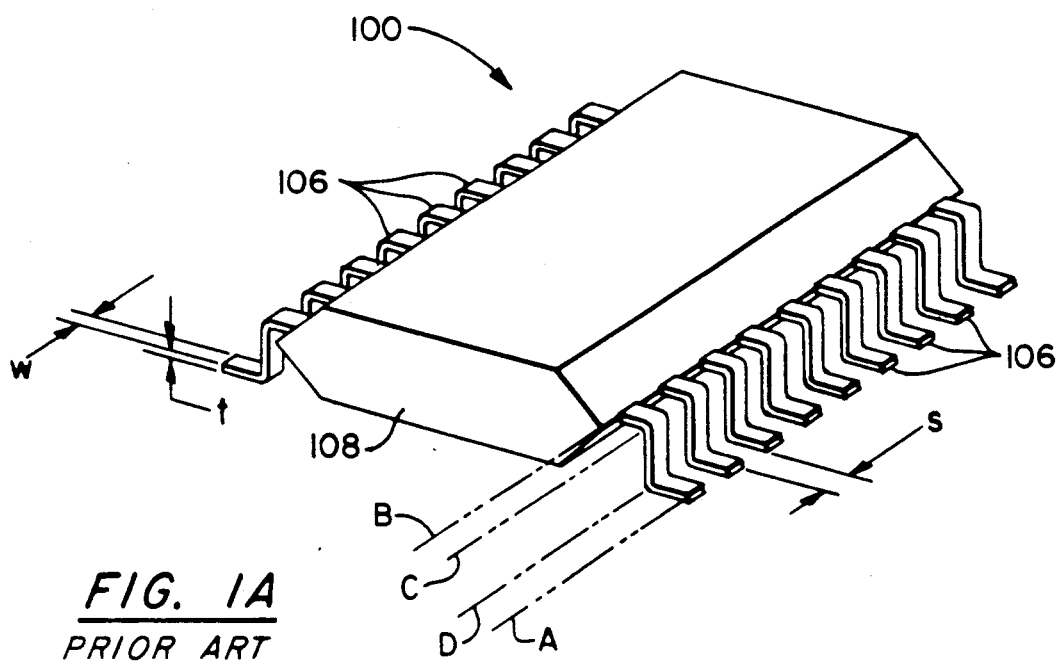
FIG. 1A is a perspective view of a completely formed plastic-packaged semiconductor device of the prior art.
Figure 1B:
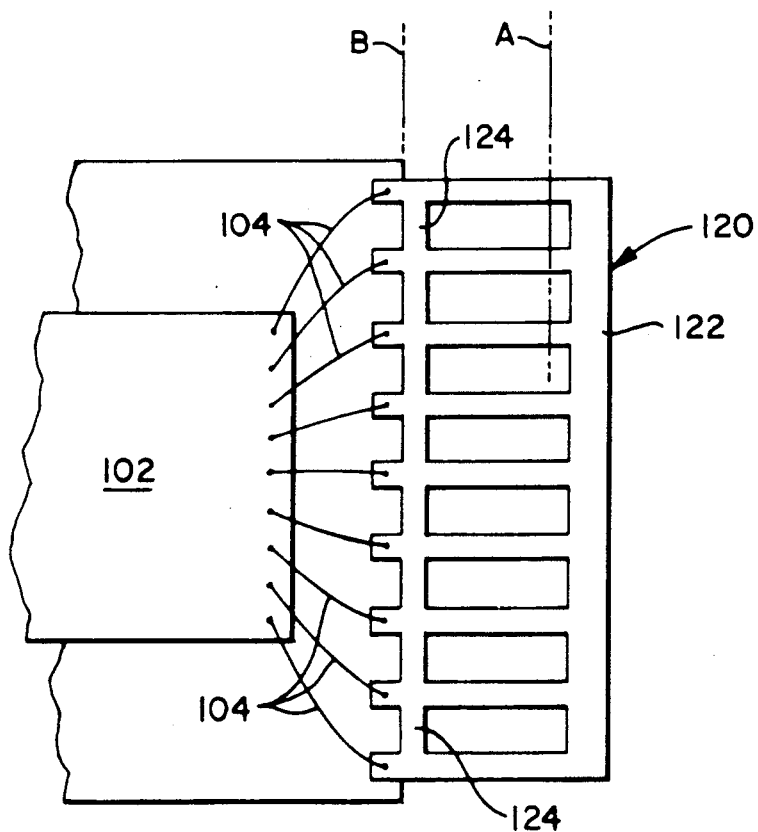
FIG. 1B is a plan view, partially cutaway, of the semiconductor device of FIG. 1A, at an intermediate step in the manufacture thereof, showing a lead frame.

FIGS. 1A and 1B illustrate a plastic-packaged semiconductor device 100 of the prior art, and are discussed hereinabove. The techniques for creating such packages are well known, including techniques for mounting a die to a lead frame, molding a plastic body about the die and inner portions of leads, excising the lead frame, and "dejunking" (removing) superfluous plastic "flash" from between the leads.

Figure 2A:
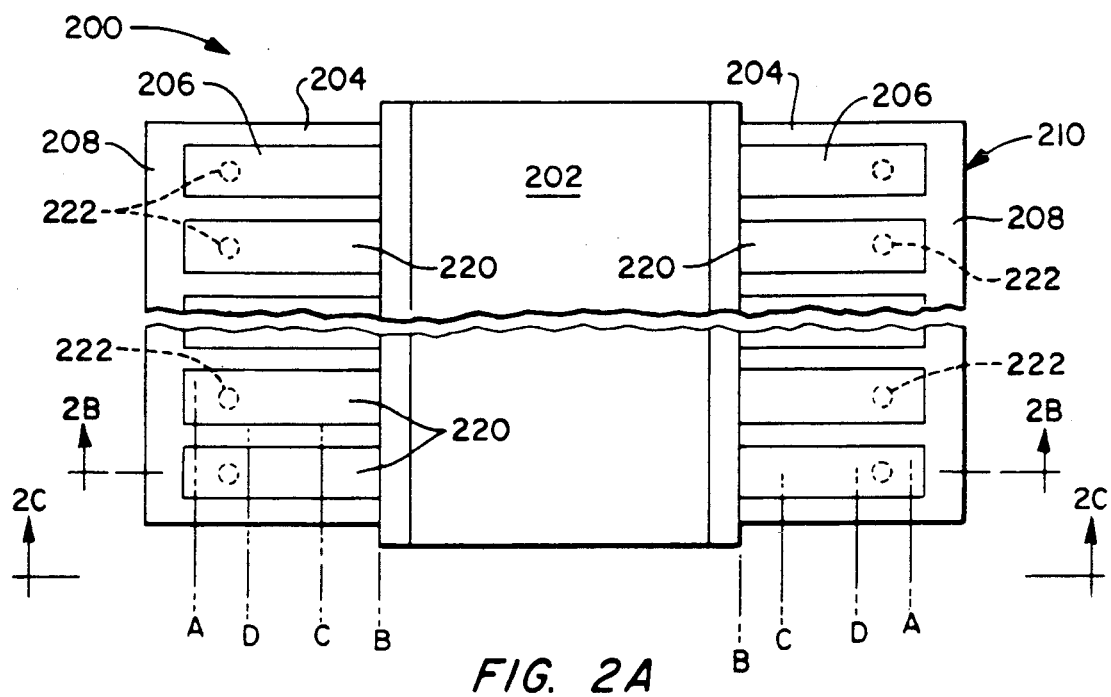
FIG. 2A is a plan view of the plastic-packaged semiconductor device of the present invention, at an intermediate step in the manufacture thereof.
Figure 2B:
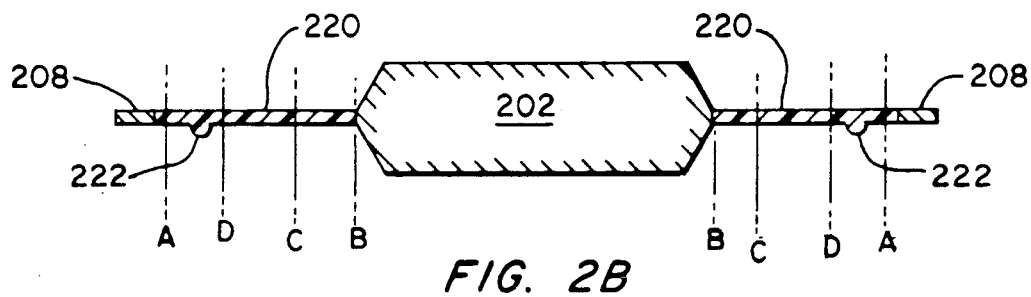
FIG. 2B is an end view of the semiconductor device of FIG. 2A.
Figure 2C:
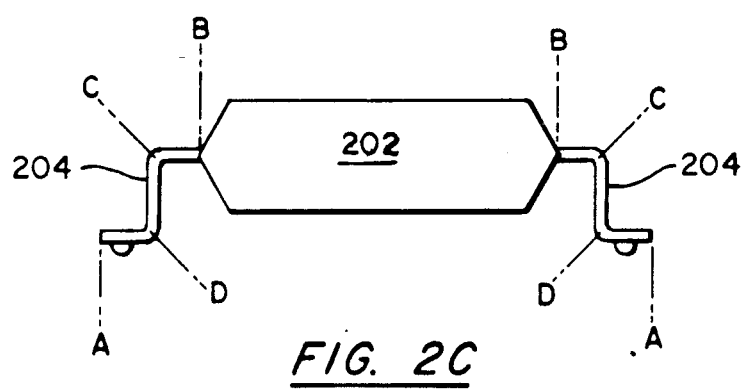
FIG. 2C is an end view of the completed plastic-packaged semiconductor device of the present invention.

FIGS. 2A, 2B and 2C show the plastic-packaged semiconductor device 200 of the present invention, in various stages of manufacture. In FIG. 2A, the device 200 is shown having a body 202 (corresponding to the body 108 of FIG. 1A) and a plurality of leads 204 (corresponding to the leads 106 of FIG. 1A). As in the prior art, the leads 204 are formed of a conductive foil having a thickness (t) on the order of a few thousandths of an inch, and the leads themselves have a width (w) on the order of six thousandths of an inch. The spacing (s) between adjacent leads is on the order of fifteen thousandths of an inch. Hence, a void space 206 is formed in the interstices between adjacent leads 204. Although not illustrated, a semiconductor die is attached to the inner ends of the leads 204, according to the techniques discussed with respect to FIGS. 1A and 1B.

As shown in FIGS. 2A and 2B, the leads 204 terminate in an outer square ring portion 208 of a lead frame 210, as in the prior art. Conspicuous by their absence are dambars (compare the dambars 124 of FIG. 1B). The void spaces 206 are thus defined by adjacent leads 204, an outer edge of the body 202 (shown by the dashed line "B"), and the square ring portion 208.

According to the present invention, the plastic molding material used to form the body 202 is caused (allowed) to "flash" (seep) into the interstices between adjacent leads 204, substantially completely filling the void spaces 206. Hence, a plastic "web" 220 is formed between each adjacent pair of conductive leads 204. Each of the webs 220 has a thickness substantially equal to the thickness (t) of the leads, and a width substantially equal to the spacing (s) between adjacent leads.

Ultimately, the square ring 208 is excised (along a line "A", as discussed with respect to FIG. 1B). In further handling of the device 200, the plastic webs in the interstices between the leads aids in supporting the leads and maintaining their coplanarity and parallelness (and lack of skew) with one another.

Although of no foreseeable practical value, it should be noted that dambars could initially be present in the lead frame 210, but they would need to be excised prior to molding, so that the plastic molding material could flow unimpeded into the voids 206.

In the illustrated example of a DIP semiconductor device, having conductive leads arranged along two opposite sides thereof, on each side of the device there are "n" leads and n-1 webs. The same principle applies to other plastic pack configurations.

As best viewed in FIGS. 2B and 2C, each web 220 is provided with a "bump" 222 projecting downwardly (as viewed in the figures) from an outer portion of the web. These bumps 222 are formed in the molding process (described below with respect to FIG. 3), intermediate the leads 204 and near the outer ends thereof.

As illustrated in FIG. 2C, the leads 204 are ultimately formed in a gull wing configuration so that their endmost portions are coplanar with the body 202, but extend below the body for mounting to wiring patterns on a printed circuit board, or the like (see FIG. 4). The support function of the interstitial webs becomes evident in this handling step.

As described above, webs 220 are formed in the entire void space 206 between each pair of adjacent leads. It is most important that the webs 220 are formed at least between the outermost (endmost) pairs of adjacent leads, i.e., at the corners of the packaged device 202.

Furthermore, it is primarily the endmost portions of the webs 220, with their attendant bumps 222 that are of interest, especially when forming the leads into a gull wing configuration. To this end, inner portions of the webs 220 can be de-junked.

In a variation of the above, although not shown, plastic can be allowed to flow over the leads, opposite the bumps 222.

Figure 3:
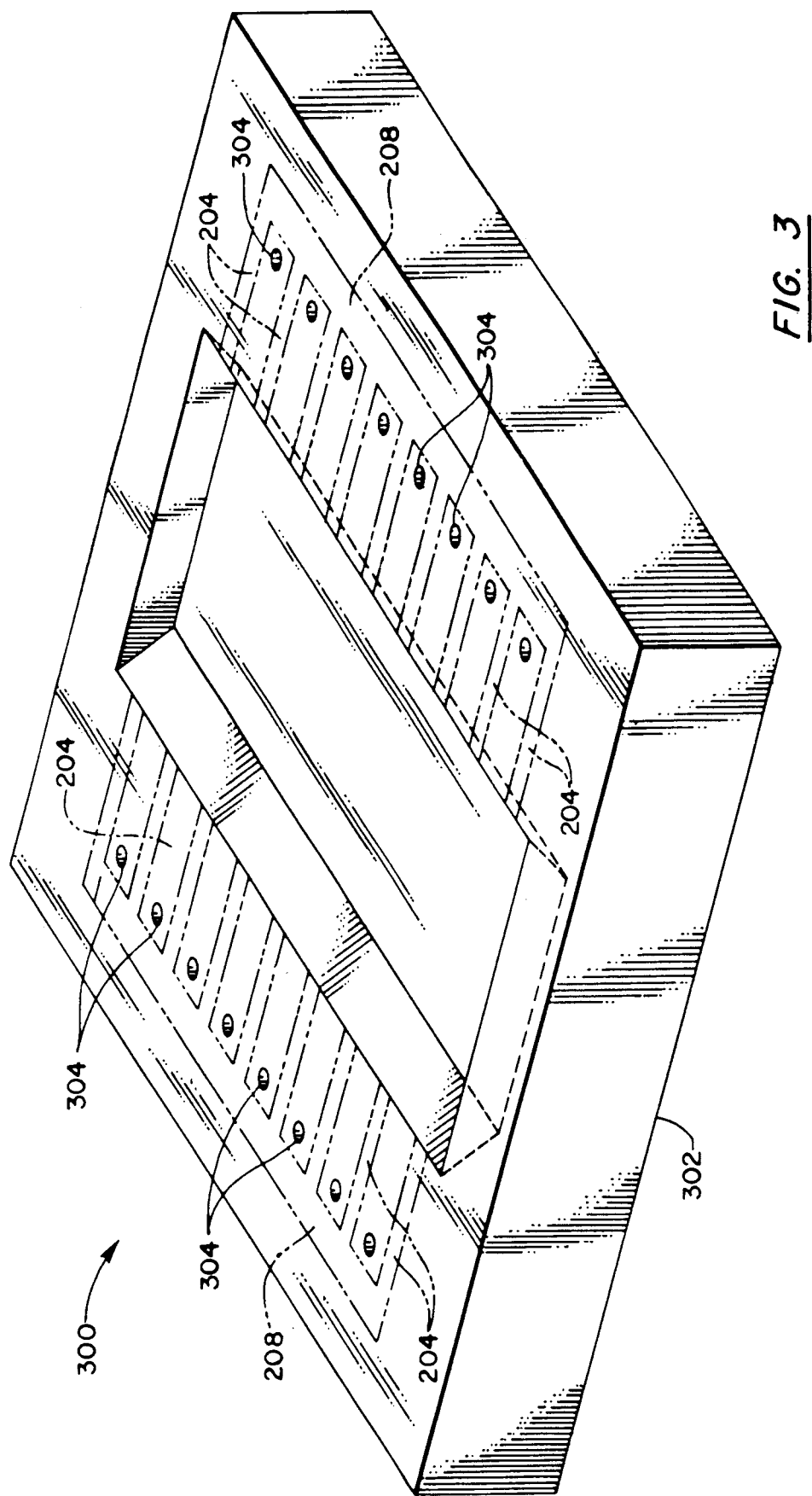
FIG. 3 is a perspective, partially cutaway view of a bottom mold half for forming the plastic-packaged semiconductor device of the present invention.

FIG. 3 shows the bottom half 302 of a mold 300 used to mold the plastic body 202, plastic webs 220 and bumps 222. Therein are seen recesses 304 for creating the bumps 222. The positions of leads 204 are shown by dashed lines. A suitable molding process is transfer molding at high pressure. Evidently, a gap is created between the clamshell halves of the mold by the leads. In the prior art, the dambars served to contain the plastic molding material within the mold. In the present invention, the plastic molding material is allowed (encouraged) to seep between the leads, exterior the body, to form the webs 220. Further seepage is limited by the outer square ring frame 208 (See FIG. 2A).

Figure 4:
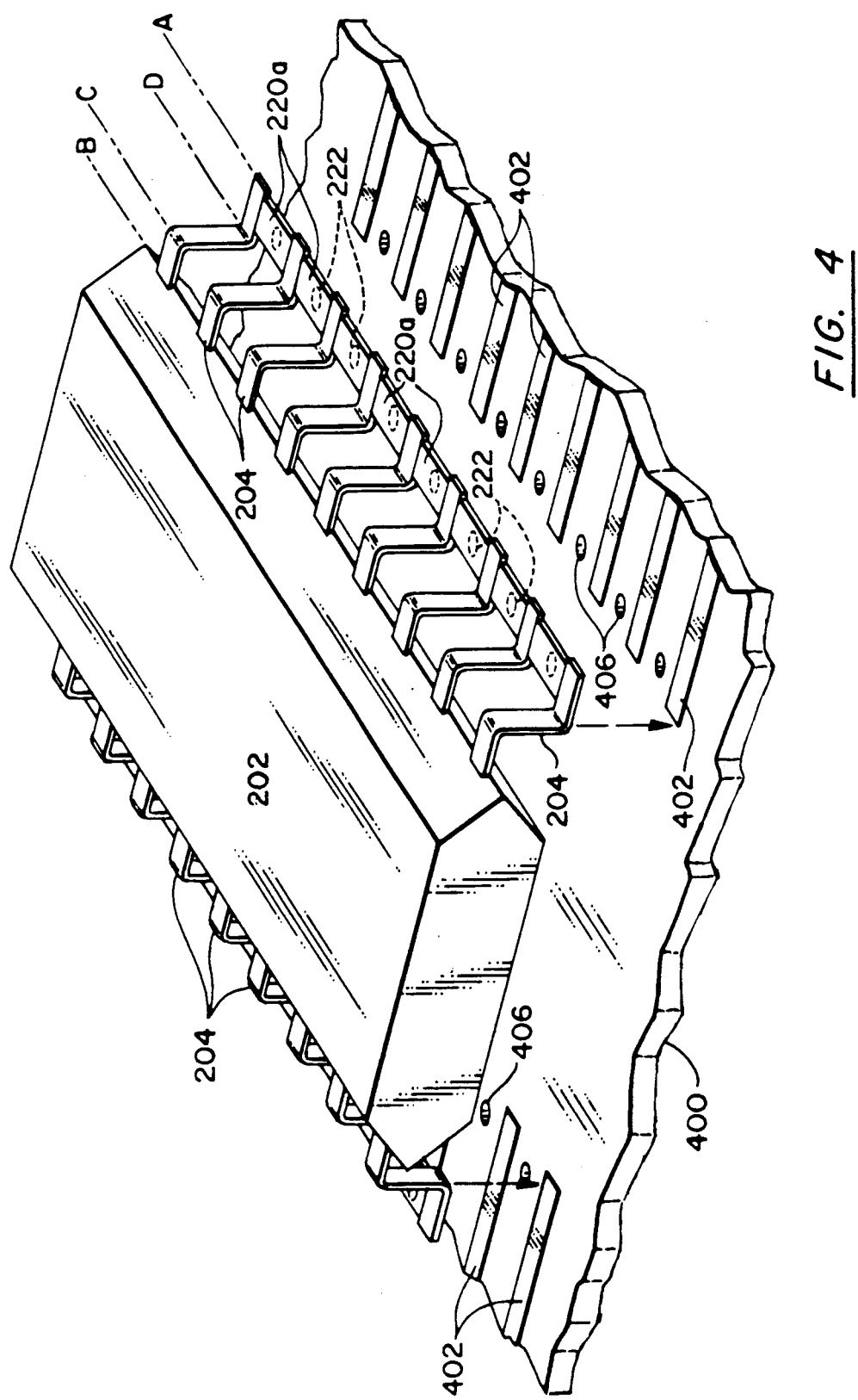
FIG. 4 is an exploded perspective view of the completed semiconductor device of the present invention, mounted to a printed circuit board.

FIG. 4 shows the completed semiconductor device 200 of the present invention positioned to be mounted to a printed circuit board 400. The printed circuit board is provided with conductors 402 forming a wiring pattern that matches (is in registration with) the configuration of (the outer ends of) the leads 204. The printed circuit board is further provided with recesses 406, which may simply be holes through the board, spaced and oriented to be in registration with the bumps 222. When the plastic-packaged semiconductor device 200 is mounted to the printed circuit board 400, the outer ends of the leads 204 align with the conductors 402, and the bumps 222 align with the recesses 406. The bumps 222 act as "lead-ins" for mounting the device 200 to the board 400 and aid in maintaining alignment of the device 200 with the board 400, notably the alignment of the leads 204 with the conductors 406. This is highly advantageous in the assembly of semiconductor devices to boards. The support function of the interstitial webs is also evident in this handling step.

It should be noted, in the context of leads (e.g., 204) resting upon conductors (e.g., 406, the leads are soldered to the conductors, such as be reflow soldering. In the context of the conductors of the wiring pattern forming a pattern around the periphery of the leads, the leads would be wire bonded or the like to the conductors.

As shown in FIG. 4, an inner portion of the webs 220 can be removed (dejunked), notably in the regions of the lead bends (indicated by the dashed lines "C" and "D"), leaving only plastic "tie-bars" 220a bridging the ends of the leads 204. The longitudinal extent (i.e., along the leads) of these tie-bars, or "attenuated webs" 220a can be on the order of 10–20 thousandths of an inch.

What is claimed is:

1. A semiconductor device for mounting to a wiring layer on a printed circuit board, comprising:
   a semiconductor chip:
   a plurality of conductive leads having inner and outer ends;
   means for connecting the chip to the inner ends of the leads;
   a plastic body formed about the chip and the inner ends of the leads; and
   means for maintaining the outer ends of the leads in alignment with one another;
   wherein:
   the means for maintaining the leads in alignment with one another is a plastic web between adjacent leads, the plastic web formed integrally with the plastic body and extending from the plastic body, between adjacent leads, to the outer ends of the leads.

2. A semiconductor device for mounting to a wiring layer on a printed circuit board, comprising:
   a semiconductor chip;
   a plurality of conductive leads having inner and outer ends;
   means for connecting the chip to the inner ends of the leads;
   a plastic body formed about the chip and the inner ends of the leads; and
   means for maintaining the outer ends of the leads in alignment with one another;
   wherein:
   the means for maintaining the leads in alignment with one another is a plastic web between adjacent leads;
   further comprising:
   means for maintaining the outer ends of the leads in alignment with conductors of wiring patterns on a printed circuit board;
   wherein:
   the means for maintaining the outer ends of the leads in alignment with wiring patterns on a printed circuit board are bumps formed at outer ends of the webs, and the bumps are formed of the same plastic material as the body and the webs.

3. A semiconductor device for mounting to a wiring layer on a printed circuit board, comprising:
   a semiconductor chip;
   a plurality of conductive leads having inner and outer ends;
   means for connecting the chip to the inner ends of the leads;
   a plastic body formed about the chip and the inner ends of the leads; and
   means for maintaining the outer ends of the leads in alignment with one another;
   further comprising:
   means for maintaining the outer ends of the leads in alignment with conductors of wiring patterns on a printed circuit board;
   wherein:
   the means for maintaining the outer ends of the leads in alignment with wiring patterns on a printed circuit board are bumps formed between the outer ends of adjacent leads.

4. A semiconductor device for mounting to a wiring layer on a printed circuit board, comprising:
   a semiconductor chip;
   a plurality of conductive leads having inner and outer ends;
   means for connecting the chip to the inner ends of the leads;
   a plastic body formed about the chip and the inner ends of the leads;
   means for maintaining the outer ends of the leads in alignment with one another; and
   means for maintaining the outer ends of the leads in alignment with conductors of wiring patterns on a printed circuit board;
   wherein:
   the printed circuit board is provided with a plurality of recess; each recess disposed between an adjacent pair of conductors; and
   the means for maintaining the outer ends of the leads in alignment with the wiring pattern is a bump formed between the outer ends of the leads, and each bump is sized and shaped to mate with a corresponding one of the recesses in the printed circuit board.

* * * * *